US005406199A

United States Patent [19]

Shah

[11] Patent Number: 5,406,199
[45] Date of Patent: Apr. 11, 1995

[54] TEST FIXTURE CARRYING A CHANNEL CARD FOR LOGIC LEVEL TRANSLATION

[75] Inventor: Nimish K. Shah, Old Bridge, N.J.

[73] Assignee: AT&T Corp., Murray Hill, N.J.

[21] Appl. No.: 98,587

[22] Filed: Jul. 28, 1993

[51] Int. Cl.6 ............................................... G01R 1/00
[52] U.S. Cl. .................................. 324/158.1; 324/763
[58] Field of Search ............... 324/158 F, 158 P, 73.1, 324/158 R, 158.1, 763; 371/15.1, 22.3, 22.6

[56] References Cited

U.S. PATENT DOCUMENTS

| | | | |
|---|---|---|---|
| 4,746,855 | 5/1988 | Wrinn | 324/158 F |
| 5,101,151 | 3/1992 | Beaufils et al. | 324/158 F |
| 5,103,168 | 4/1992 | Fuoco | 324/158 F |
| 5,124,638 | 6/1992 | Winroth | 324/158 R |
| 5,216,361 | 6/1993 | Akar et al. | 324/158 F |
| 5,262,716 | 11/1993 | Gregory, Jr. et al. | 324/158 P |

Primary Examiner—Vinh Nguyen
Attorney, Agent, or Firm—Robert B. Levy

[57] ABSTRACT

A test fixture (14) for coupling a circuit board (12) to an automatic testing machine (13) includes a translator board for coupling each of a plurality of test pads (26) on the board to a separate one of a plurality connecting members (22) arranged in spaced-apart rows. Each row of connecting members is coupled via a paddle card (36) and a channel card (44) to a separate channel of the testing machine (13). In accordance with the invention, a paddle card (36') containing circuitry (52') for signal logic level translation may be substituted for one of the paddle cards (36) when it is necessary to translate the logic level of certain signals passing between the testing machine (13) and the circuit board (12).

5 Claims, 1 Drawing Sheet

TEST FIXTURE CARRYING A CHANNEL CARD FOR LOGIC LEVEL TRANSLATION

TECHNICAL FIELD

This invention relates to a test fixture for coupling a circuit board under test to an automatic testing machine.

BACKGROUND OF THE INVENTION

Individual circuit boards are commonly tested by placing each board on a test fixture coupled to an automatic testing machine. The test fixture usually includes a planar member, generally referred to as a translator board. On a first surface of the translator board is a first plurality of connecting members arrayed to each make contact with a separate one of a plurality of nodes on the circuit board into which test signals are to be launched by the testing machine and from which responses are recovered for analysis. On a second, opposing surface of the translator member is a plurality of second connecting members arrayed in spaced rows. Each first connecting member is electrically coupled to a corresponding second connecting member. In this way, each node of the array on the circuit board is effectively "translated" to a separate one of the second connecting members.

Each of the rows of second connecting members on the translator board is electrically connected by way of a separate paddle card to a corresponding channel card connected to a separate channel of the testing machine. In the past the paddle cards have been passive, electrically conducting members, each typically taking the form of a conventional circuit board of FR-4 or the like.

Traditionally, most automatic testing machines have been designed to launch TTL-level signals into, and to recover TTL-level responses from, the circuit board under test. In the event that the circuit board under test has one or more nodes that are designed to receive and/or generate signals at a logic level other than the TTL-level, such as CMOS, ECL, DCL, DTL or DECL levels, for example, then a signal level translator is required. In the past, active logic devices (i.e., electronic circuits) were mounted directly on the translator board for translating any non-TTL level signal and/or response to a TTL level as required.

The disadvantage of this approach is that each translator board is custom-designed in order to achieve the necessary translation between the nodes on the circuit board under test and the spaced rows of second connecting members on the translator board second surface. Given its custom nature, fabrication of each translator board using mass production techniques is impractical, thus making translator board fabrication time-consuming and costly. Adding active logic to the translator board to perform whatever signal-level translation may be required only serves to increase the complexity of the translator board, thus increasing its fabrication time and cost.

Thus, there is a need for a test fixture which accomplishes any required signal-level translation at a far lower complexity and cost as compared to the prior art.

SUMMARY OF THE INVENTION

Briefly, the present invention is directed to a test fixture for coupling a circuit board to an automatic testing machine. The test fixture includes a translator board having a plurality of first connecting members arrayed on a first surface for making electrical contact with a separate one of a plurality of test nodes on the circuit board to be tested. On a second, opposed surface of the translator board is a plurality of second connecting members arrayed in spaced rows, each second connecting member electrically coupled to a corresponding one of the first connecting members so as to carry a test signal to, and responses from, a separate circuit board node. The second connecting members in each of the rows are coupled by a separate one of a set of paddle cards to a separate one of a set of channel cards, each coupled to a separate channel of the automatic testing machine.

In accordance with the invention, at least one paddle card carries electronic circuitry, typically in the form of one or more driver circuits, for performing the required logic level translation of test signals supplied to, and responses generated by, the circuit board. In this way, the automatic testing machine may generate all of its test signals, and process all of the responses it receives, at one logic level (say TTL) even if a different logic level is required for a particular one of the nodes of the circuit board under test. Should any node on the circuit board under test require a different logic level test signal, or generate a different logic level response than the logic level of the automatic testing machine, the logic level translation will occur at the appropriate paddle card. Since the paddles cards are each cheaper and less time-consuming to fabricate than the translator board, the test fixture of the invention is thus less expensive and easier to fabricate than the prior art test fixture.

DETAILED DESCRIPTION

Figure 1:
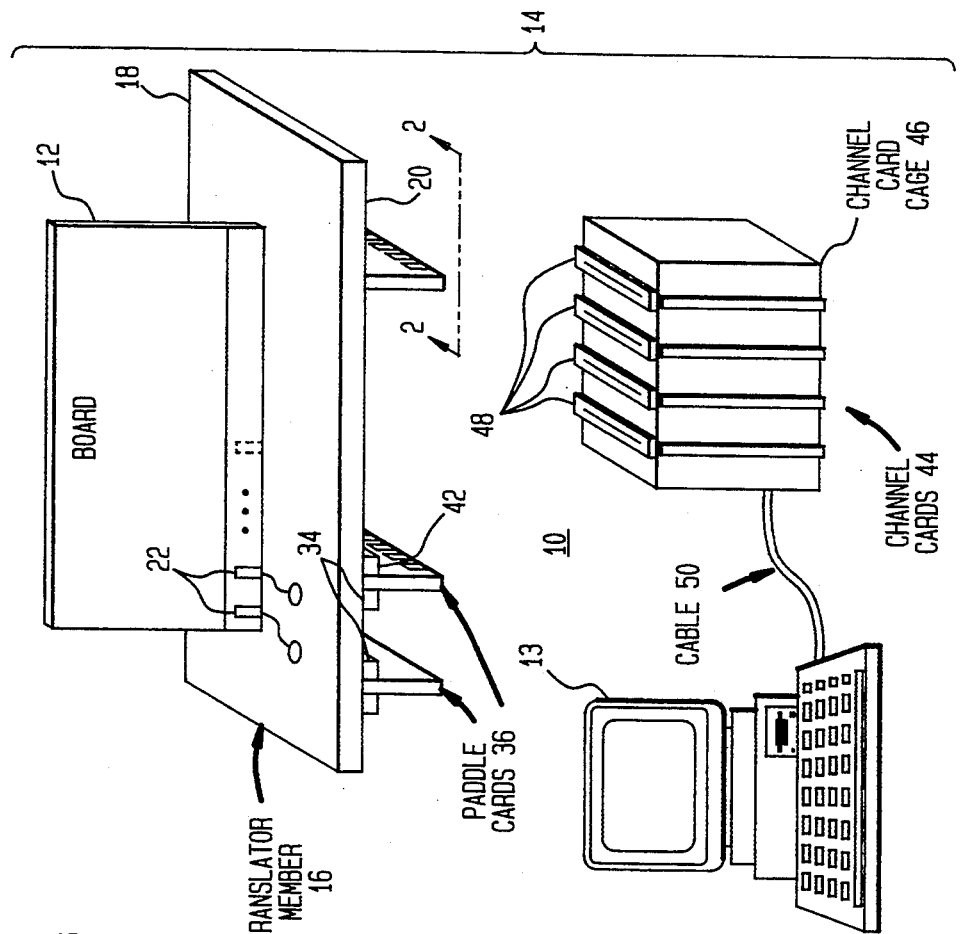
FIG. 1 is a block diagram of a prior art test system.

In order to appreciate the nature of the present invention, a description of a test system in which the invention is employed will be provided. Referring to FIG. 1, there is shown a prior art system 10 for electronically testing a circuit board 12 to detect faults, if any, therein. The test system 10 includes an automatic testing machine 13, typically a computer, that is programmed to supply test signals to the circuit board 12 and to recover responses generated by the board following receipt of the test signals. In addition to the testing machine 13, the test system 10 includes a test fixture 14 for coupling test signals from the testing machine 13 to the circuit board 12, and for coupling responses from the circuit board to the testing machine.

Figure 2:
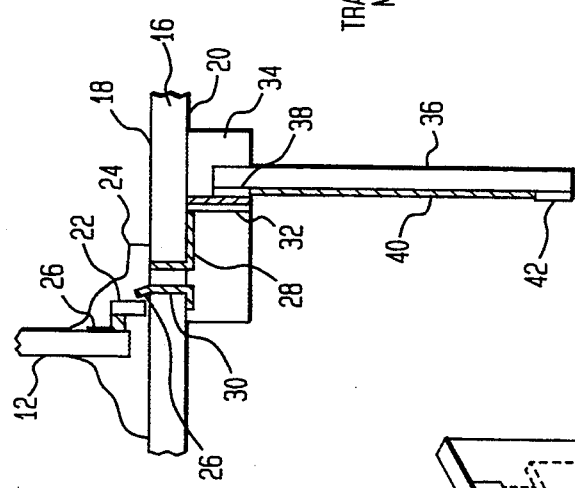
FIG. 2 is a side view of a portion of the test system of FIG. 1.

The test system 14 includes a translator board 16 having first and second opposed surfaces 18 and 20, respectively. The first surface 18 of the translator board 16 carries a plurality of first connecting members 22, which, as best illustrated in FIG. 2, each typically take the form of a separate contact of an edge connector 24 designed to mate with an edge of the circuit board 12. Each of the first connecting members 22 is arrayed the same as a separate one of a plurality of metallized pads 26 (i.e., test nodes) on the circuit 12. Thus, when the circuit board 12 is received in the edge connector 24, each first connecting member 22 mates with, so as to be electrically connected to, a corresponding circuit board pad 26.

Although each first connecting member 22 has been depicted in FIG. 2 in the form of an electrical contact within the edge connector 24, the connecting member could easily take another form. For example, each first connecting member 22 could easily take the form of a nail or pin (not shown) of the type found in a conventional bed-of-nails test fixture.

The first connecting members 22 are each electrically connected to a separate one of a set of metallized conductors 26 on the surface 18 of the translator board 16. Each metallized conductor 26 is connected to a metallized conductor 28 on the surface 20 of the translator board by way of one or more metallized through-holes 30 (only one shown in FIG. 2). (In the case where the translator board 16 has multiple layers, each conductor 26 may be connected via conductors (not shown) on intermediate layers (not shown) before being coupled to the conductor 28 on the surface 20.)

Each conductor 28 is electrically connected to a separate one of a plurality of second connecting members 32 carried by the undersurface 20 of the translator board 16. In practice, each second connecting member 32 comprises a separate one of the linearly arrayed contacts within one of a plurality of edge connectors 34 (only one shown in FIG. 2) mounted to the surface 20 of the translator board 16 in spaced-apart rows. Each edge connector 34 serves to engage the edge of a paddle card 36 such that each second connecting member 32 mates with a separate one of a plurality of spaced-apart metallized pads 38 (only one shown in FIG. 2) located at a first end (i.e. upper end as seen in FIG. 2) of the paddle card. Each of the pads 38 is coupled by a separate metallized conductor 40 on the paddle card 36 to a metallized pad 42 at the opposite (i.e. lower end) of the paddle card.

The paddle cards 36 are each coupled at their lower end to a separate one of a plurality of channel cards 44 held in a channel card cage 46 via an edge connector on the channel card. Like the paddle cards 36, the channel cards 44 each take the form of a circuit board made from FR-4 material or the like. The channel cards 44 are connected to the testing machine 13 via a cable 50.

In the past the paddle cards 36 have served as passive conductors, simply carrying signals between the circuit board 12 and the testing machine 13 without any modification or alteration. In the event that active logic circuitry was necessary to translate the logic level of the signals passing between the circuit board 12 and the testing machine 13, such circuitry was provided directly on the translator board 16. This incurred the disadvantage of increasing the cost of, and the fabrication time for, the translator board 16.

Figure 3:
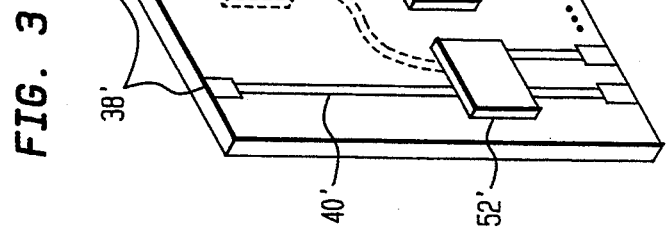
FIG. 3 is a perspective view of a paddle card, in accordance with the present invention, for use with the test system of FIG. 1.

To overcome the disadvantage incurred by the prior art fixture 14 of FIG. 1, there is provided an improved paddle card 36', as shown in FIG. 3, for substitution with any of the paddle cards 36 of FIG. 1. As will be better described below, the paddle card 36' carries whatever active logic circuitry is needed for performing the required logic level translation to convert the logic level of signals passing between the circuit board 12 and the testing machine 13 to a desired level.

As best shown in FIG. 3, the paddle card 36' of the invention comprises a circuit board formed of FR-4 material or the like so as to be interchangeable with each paddle card 36 of FIG. 1. In this regard, the paddle card 36' of FIG. is provided with a first and second set of metallized pads 38' and 42', respectively, at its first (i.e., upper) and second (i.e., lower) ends, respectively, so as to be arrayed the same as the pads 38 and 42, respectively, on the prior art paddle card 36 of FIG. 1. The major difference is that various of the pads 38' on the paddle card 36' are linked by an individual one of a set of metallized conductors 40' to a separate one of a set of circuits 52' (i.e., integrated circuits) that, in turn, are coupled by other of the conductors to various of the pads 42'.

The nature of the circuits 52 and the manner in which they are linked to the pads 38' and 42' are dependent on which of the signals passing between the circuit board 12 and testing machine of FIG. 1 requires a signal logic level translation, and what type of translation is required. In practice, the circuits 52' may comprise type 41 LG line driver circuits manufactured by AT&T Microelectronics, Allentown, Pennsylvania, for providing signal logic level translation between TTL logic level signals and ECL, CMOS, BTL, or DCL level signals.

There are several distinct advantages to providing the required logic level translation circuits 52' on the paddle card 36' as compared to providing such circuitry on the translator board 16 as taught by the prior art. First, each paddle card 36' is far less costly to fabricate. Indeed, the translator board 16 must be customized for each particular circuit board 12 of FIG. 1. By comparison, the paddle card 36', even with its circuitry 52', is still more standardized, and is typically smaller than the translator board 16 of FIG. 1, so as to be cheaper to make. In particular, given that the test fixture 14 of FIG. 1 may require several paddle cards 36' and that different fixtures often use the same type of paddle cards, the overall paddle card volume is usually sufficiently large to allow them to be mass produced, which reduces their fabrication costs.

The foregoing describes a test fixture 14 which incorporates at least one "smart" paddle card 36', which carries circuitry (i.e., circuits 52') for performing all necessary signal level logic translation for signals passing through the card between a circuit board 12 under test and a testing machine 13.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A system for testing a board under test comprising:
   a testing machine having a plurality of channels, each channel supplying test signals to, and receiving test responses from, the board under test;
   a test fixture having a first plurality of connecting members on a first surface arrayed for connection to the board under test so as to pass test signals thereto and to receive responses therefrom and a second plurality of connecting members arrayed in a plurality of spaced arrayed rows on second, opposed surface, each of the first connecting members electrically coupled to a separate one of the second connecting members;
   a plurality of channel cards, each coupled to a separate one of the channels of the testing machine for providing an electrical connection to said channel to facilitate the passage of test signals therefrom and the passage of test responses thereto; and a plurality of paddle cards, each providing an electrical connection between a separate one of the second connecting members of the test fixture and a separate one of the channel cards, Wherein the improvement comprises:

at least one of the paddle cards contains at least one circuit for electronically translating responses received from the circuit board from a first logic level to a second logic level.

2. The apparatus according to claim 1 wherein each circuit carried by the paddle card comprises a line driver.

3. The apparatus according to claim 2 wherein each line driver circuit is operative to convert a signal at TTL level to ECL level and to convert a signal at ECL level to TTL level.

4. The apparatus according to claim 2 wherein each line driver circuit is operative to convert a signal at TTL level to ECL level and to convert a signal at CMOS level to TTL level.

5. The apparatus according to claim 2 wherein each line driver circuit is operative to convert a signal at TTL level to BTL level and to convert a signal at BTL level to TTL level.

* * * * *